United States Patent [19]

Iizuka et al.

[11] Patent Number: 5,333,167
[45] Date of Patent: Jul. 26, 1994

[54] MASK STRUCTURE FOR X-RAY EXPOSURE AND X-RAY EXPOSURE DEVICE AND METHOD USING IT

[75] Inventors: Takashi Iizuka, Zama; Yasuaki Fukuda, Hadano, both of Japan

[73] Assignee: Canon Kabushiki Kaisha, Tokyo, Japan

[21] Appl. No.: 984,527

[22] Filed: Dec. 2, 1992

[30] Foreign Application Priority Data

Dec. 4, 1991 [JP] Japan ................................ 3-347620

[51] Int. Cl.$^5$ .............................................. G21K 5/00
[52] U.S. Cl. .......................................... 378/35; 378/34
[58] Field of Search .................... 378/34, 35, 204, 205, 378/207, 208

[56] References Cited

U.S. PATENT DOCUMENTS

| | | | |
|---|---|---|---|
| 4,964,145 | 10/1990 | Maldonado | 378/35 |
| 5,012,500 | 4/1991 | Watanabe et al. | 378/35 |
| 5,042,945 | 8/1991 | Shibata et al. | 356/150 |
| 5,048,066 | 9/1991 | Fukuda | 378/34 |
| 5,052,033 | 9/1991 | Ikeda et al. | 378/35 |

FOREIGN PATENT DOCUMENTS

| | | | |
|---|---|---|---|
| 58-118648 | 7/1983 | Japan | 378/35 |
| 1282818 | 11/1989 | Japan | 378/35 |

Primary Examiner—David P. Porta
Attorney, Agent, or Firm—Fitzpatrick, Cella, Harper & Scinto

[57] ABSTRACT

A mask structure for X-ray exposure comprises a retaining frame, a supporting frame, a mask support and an absorber pattern. The mask structure possesses a function for detecting a state change of the mask structure from its steady state.

34 Claims, 6 Drawing Sheets

MASK STRUCTURE FOR X-RAY EXPOSURE AND X-RAY EXPOSURE DEVICE AND METHOD USING IT

BACKGROUND OF THE INVENTION

1. Field of the Invention

The present invention relates to a mask structure for X-ray exposure for use in the manufacture of ICs, LSIs and the like, and an X-ray exposure device using this mask structure.

2. Related Background Art

Figure 2:
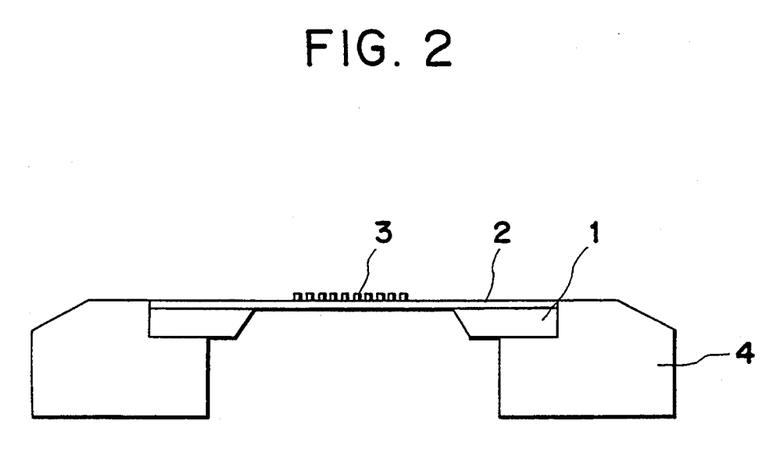
FIG. 2 is a schematic sectional view of a conventional mask structure.

In recent years, the development of X-ray exposure devices has been energetic with the increase of the density of LSIs and the like. Most of the X-ray mask structures for X-ray exposure are of such a permeable type as shown in FIG. 2. In general, a mask support 2 is formed from a material having a high X-ray permeability and a high mechanical strength on a mask supporting frame 1 comprising silicon single crystal, and an X-ray absorber pattern 3 of gold, tungsten or the like is further formed thereon. All of these members are mounted on a retaining frame 4.

An exposure system using such a mask structure is called a proximity system in which exposure is carried out maintaining a distance between the mask and a wafer at about 30–50 μm. In this system, a stage is moved from one image to a next image to be exposed after the distance between the mask and the wafer is spread to about 150 μm in order to prevent the mask from hitting against the wafer and breaking, and afterward the distance between the mask and the wafer is adjusted to 30–50 μm again for the sake of the next exposure.

However, the X-ray mask support 2 is required to support the X-ray absorber pattern 3 and to have a high X-ray permeability, and therefore a film having a high mechanical strength and made of silicon nitride, silicon carbide or the like is self-supportingly used, with the thickness of the film being about 2 μm. Therefore, when the distance between the mask and the wafer is changed at the movement of the stage from one image to the next region to be exposed in accordance with the proximity system, a pressure fluctuation occurs, so that pressure is applied to the mask support 2, with the result that the mask support 2 is bent inconveniently. In this case, a maximum bend quantity of the mask support 2 is as much as 10 μm, and so a time of about 0.1 to 1 second is taken to relieve the bend.

Furthermore, when the mask support is electrified during the exposure, the mask support 2 bends similarly, as in the above case.

If the exposure is carried out with the mask support 2 being bent, a print error of the pattern takes place inconveniently.

Additionally, in an X-ray exposure device of a type in which the exposure is carried out setting the wafer and the mask vertically to the ground, chucking deviates owing to the gravity forces on the mask structure and other external factors sometimes, and in the worst case, the mask falls and breaks.

SUMMARY OF THE INVENTION

Thus, an object of the present invention is to provide an X-ray mask structure having a function which can detect the bend of a mask support and the deviation of mask chucking in order to improve yield and reliability in using an X-ray exposure device.

The above-mentioned object can be achieved by the present invention.

That is, a first aspect of the present invention is directed to a mask structure for X-ray exposure which comprises a retaining frame, a supporting frame, a mask support and an absorber pattern, said mask structure being characterized by possessing a function for detecting a state change of said mask structure from its steady state.

A second aspect of the present invention is directed to an X-ray exposure device using a mask structure for X-ray exposure described above, said X-ray exposure device being characterized by being controlled so as to begin exposure after a detected change of the bend quantity of said mask support has returned to a steady state.

A third aspect of the present invention is directed to an X-ray exposure device using a mask structure for X-ray exposure described above, said X-ray exposure device being characterized by being provided with a mask fall preventing mechanism which operates in accordance with a signal obtained by detecting an acceleration applied to said mask structure.

A fourth aspect of the present invention is directed to an X-ray exposure device using a mask structure for X-ray exposure described above, said X-ray exposure device being characterized by being provided with a mask breakage preventing mechanism which operates in accordance with a signal obtained by detecting an acceleration applied to said mask structure.

A fifth aspect of the present invention is directed to a mask structure for X-ray exposure which comprises a retaining frame, a supporting frame, a mask support and an absorber pattern, said mask support being provided with a piezoelectric displacement sensor.

A sixth aspect of the present invention is directed to a mask structure for X-ray exposure which comprises a retaining frame, a supporting frame, a mask support and an absorber pattern, said mask support being provided with an acceleration sensor.

DETAILED DESCRIPTION OF THE PREFERRED EMBODIMENTS

The present inventors have intensively researched to solve the above-mentioned problems of conventional techniques, and as a result, it has been found that if a built-in sensor capable of detecting a state change from a steady state is attached to a mask structure, information of the bend of a mask support, the deviation of mask chucking, the drop of the mask and the like can be detected, and by feeding back the information to the mask structure, yield and reliability can be improved. The present invention has now been attained on the basis of this knowledge.

EXAMPLE 1

Figure 1A:
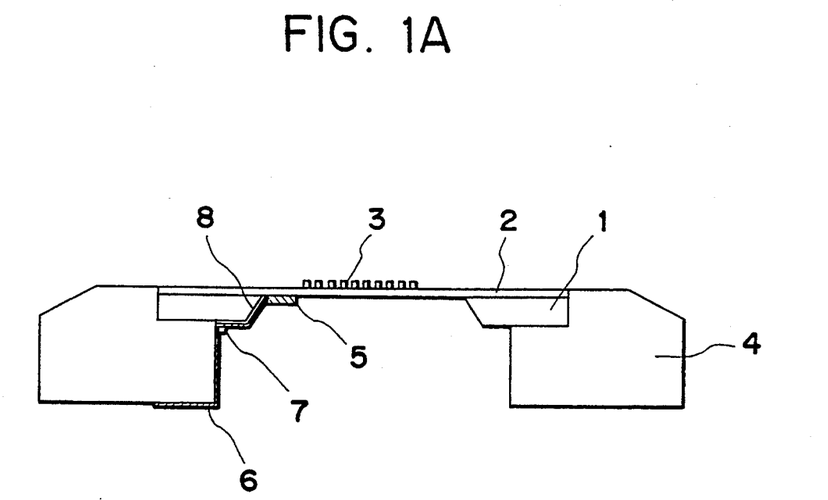
FIG. 1A is a schematic sectional view of a mask structure with a built-in piezoelectric displacement sensor.
Figure 1B:
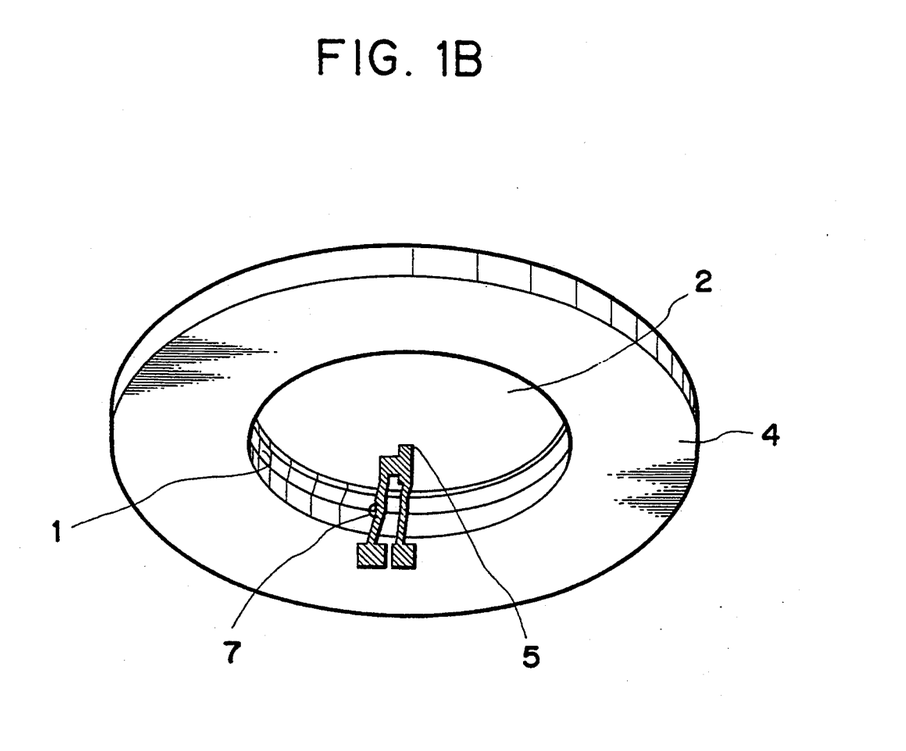
FIG. 1B is a perspective view of the mask structure in FIG. 1A.

FIG. 1A is a schematic sectional view of a mask structure with a built-in piezoelectric displacement sensor which is one embodiment of the present invention, and FIG. 1B is its perspective view.

The mask structure for X-ray exposure of the present invention is characterized by forming a piezoelectric thin film 5 on a mask support 2 in addition to a conventional mask structure comprising a supporting frame 1, the mask support 2, an absorber pattern 3 and a retaining frame 4. Incidentally, in FIGS. 1A and 1B, the piezoelectric thin film 5 is formed on a side opposite to the surface on which the absorber pattern 3 is formed, but it may be formed on the surface having the absorber pattern 3.

Signals taken out from upper and lower portions of the piezoelectric thin film 5 are led, through an electrode 6 along the retaining frame 4, to an output terminal disposed at a position where the output terminal is superposed upon a signal terminal portion on a mask chuck not shown.

Figure 3:
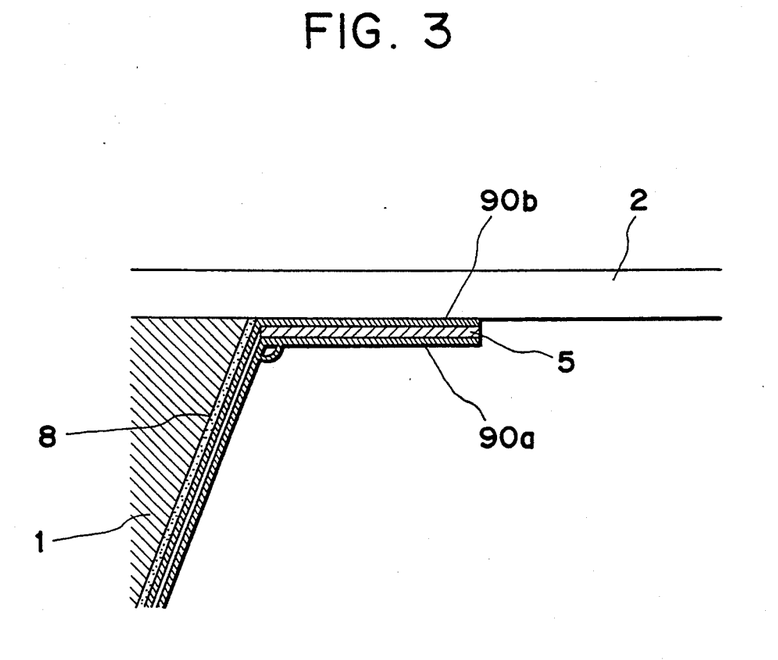
FIG. 3 is a partially enlarged view of the piezoelectric displacement sensor in FIGS. 1A and 1B.

FIG. 3 is a partially enlarged sectional view of a piezoelectric displacement sensor portion having the piezoelectric thin film 5. On a position such as a joint between the supporting frame 1 and the retaining frame 4, a wire bonding 7 or the like is formed to secure the conductivity of the lead-out electrode 6. On the other hand, when the electrode 6 is formed on a conductive place of the single crystal silicon supporting frame or the like, it is preferred that an insulating film 8 is beforehand formed thereon.

For example, when the mask support 2 is formed from a silicon nitride film having a thickness of 2 $\mu$m and the opening diameter of the supporting frame 4 is 50 mm, the maximum bend quantity of the mask support 2 attributed to the fluctuation of a mask-wafer distance is about 10 $\mu$m. Furthermore, when a barium titanate film having a size of 5×1 mm and a thickness of 3,000 Å is formed on the support 2, a displacement quantity at its end portion is about 4 $\mu$m. Therefore, an output voltage of from about $1.5 \times 10^{-6}$ V to about $2 \times 10^{-6}$ V can be obtained. Additionally, when one barium titanate film is further laminated changing a polar direction, an output voltage about 8 times as much as the above case can be obtained at the same displacement quantity, and the constitution just described permits the improvement of sensitivity.

The X-ray exposure device can be provided with a control mechanism. According to this control mechanism, the output signal obtained in the above-mentioned way is always monitored during the operation of the exposure device, and when the bend quantity of the mask support 2 is less than such a value as to provide a desired quality, exposure is begun, whereby the exposure for permitting high throughput can be achieved without print errors due to the bend of the mask support.

EXAMPLE 2

Figure 4A:
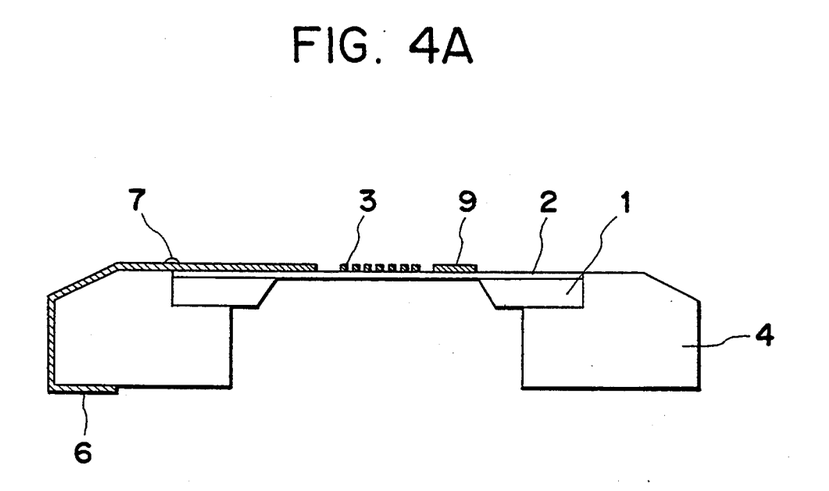
FIG. 4A is a schematic sectional view showing the mask structure in Example 2.
Figure 4B:
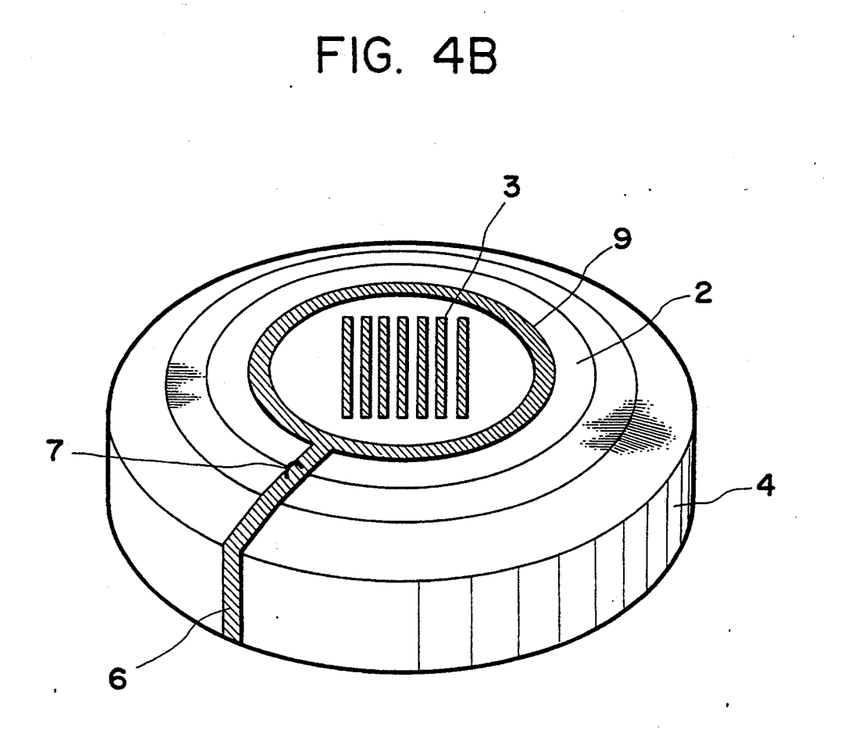
FIG. 4B is a perspective view of the mask structure in FIG. 4A.

FIG. 4A is a schematic sectional view of a mask structure with a built-in piezoelectric displacement sensor which is another embodiment of the present invention, and FIG. 4B is its perspective view.

On a mask support 2 of a conventional mask structure, a metallic electrode 9 is formed in a ring form corresponding to an opening diameter of a supporting frame 4, and an electrode 6 extends from the ring electrode 9 to a signal terminal portion of a mask chuck not shown along the surface of the supporting frame 4. The formation of the metallic electrode 9 can be achieved by using a film formation technique such as sputtering or resistance heating after the surface of the mask support is masked in an optional form, but it is preferred that the electrode 9 may be integrally formed at the time of the formation of an absorber pattern 3, since the process can be simplified.

Figure 5:
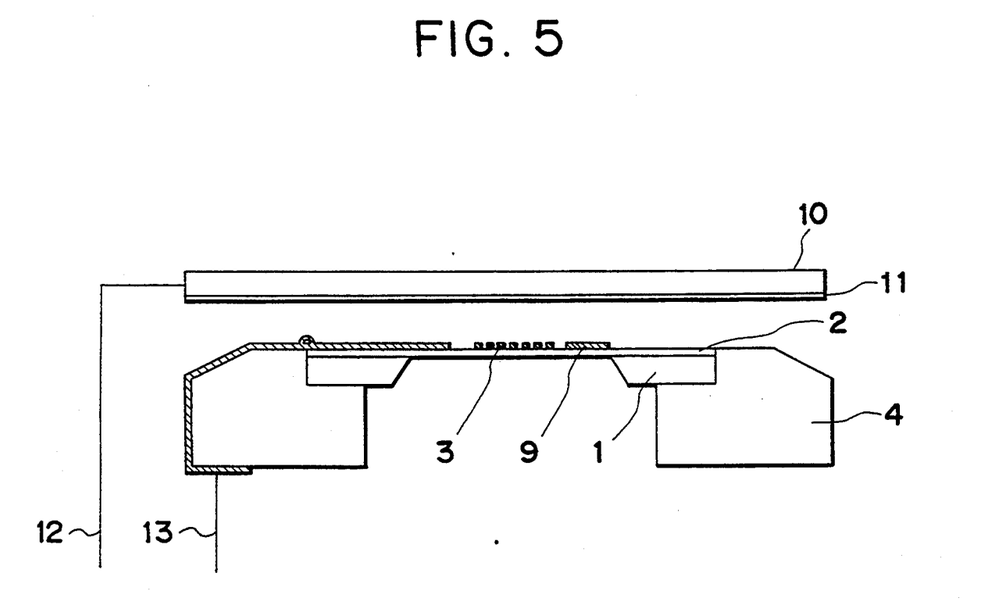
FIG. 5 shows a constitution in which an electric capacity between a wafer and a mask is measured by the use of the mask structure in FIGS. 4A and 4B.

In the case that the above-mentioned mask structure is used, the bend of the mask support is measured under such a constitution as shown in FIG. 5. At the time of the exposure, the mask structure and a wafer 10 coated with a resist 11 are maintained with the interposition of a gap of about 50 $\mu$m, as shown in FIG. 5. In this case, the wafer 10 and the metallic electrode 9 make a parallel flat type capacitor, and its capacity is inversely proportional to a distance between both the members. Therefore, the wafer-mask distance can be measured by monitoring the capacity between a signal wire 12 extending from the wafer 10 and a signal wire 23 extending from the mask.

For example, in the case of using the mask support 2 comprising a silicon nitride film of 2 $\mu$m in thickness, the supporting frame 4 having an opening diameter of 50 mm and the ring-like metallic electrode 9 having an inner diameter of 40 mm and an outer diameter of 50 mm formed on the mask support 2, and in the case of maintaining the mask-wafer distance at 50 $\mu$m, the capacity between the wafer 10 and the mask structure is hundreds of pF in view of a thickness and a permittivity of the resist.

In this case, if the mask support bends at most 10 $\mu$m under the influence of the movement of a wafer state, a fluctuation of the mask-wafer distance in the existent portion of the metallic electrode 9 is about 2-5 $\mu$m on the average. This fluctuation corresponds to 2-10% of the gap length therebetween, and the capacity also fluctuates as much as several tens of pF in accordance with the above-mentioned fluctuation.

Therefore, the X-ray exposure device can be provided with a control mechanism, and according to the control mechanism, exposure is begun, when the mask-wafer distance is less than such a value as to provide a desired quality, whereby the exposure for permitting high throughput can be achieved without print errors due to the bend of the mask support.

Incidentally, in the system used in this example, response velocity and precision can be further improved by the use of a substrate having a low resistivity and a conductive resist.

EXAMPLE 3

Figure 6:
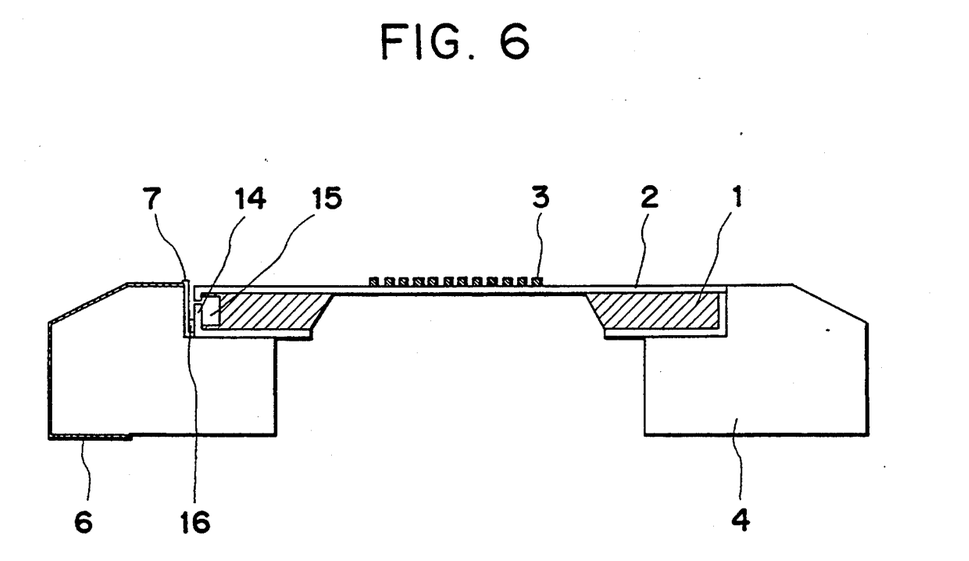
FIG. 6 is a schematic sectional view showing the mask structure in Example 3.

FIG. 6 is a schematic sectional view showing the X-ray exposure mask structure with a built-in acceleration sensor in this example.

Figure 7A:
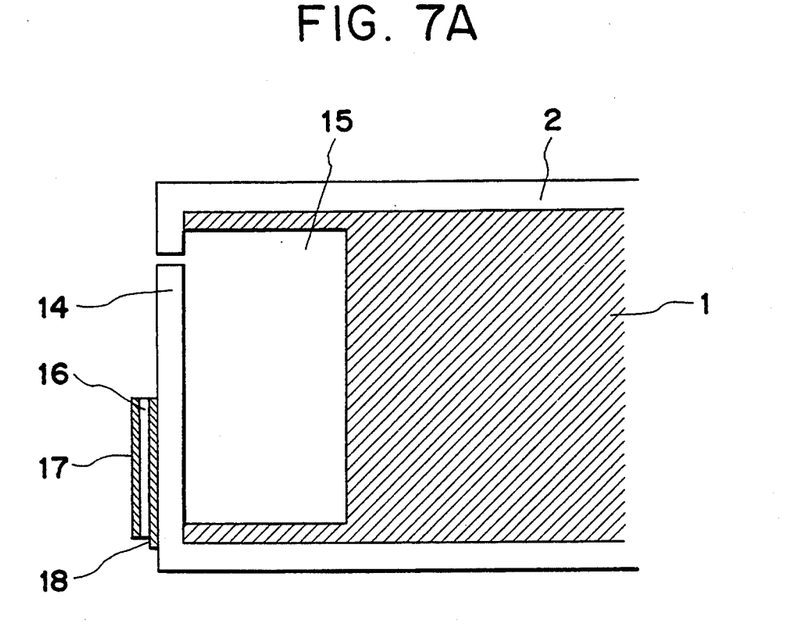
FIG. 7A is an enlarged schematic sectional view of an acceleration sensor portion in FIG. 6.
Figure 7B:
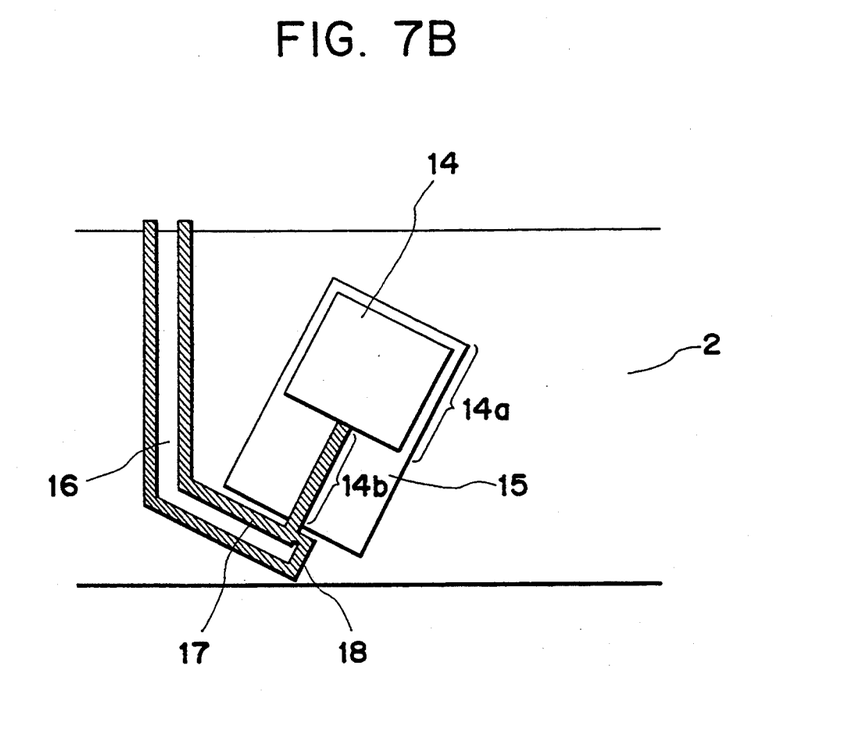
FIG. 7B is an enlarged schematic front view of the acceleration sensor portion.
Figure 8:
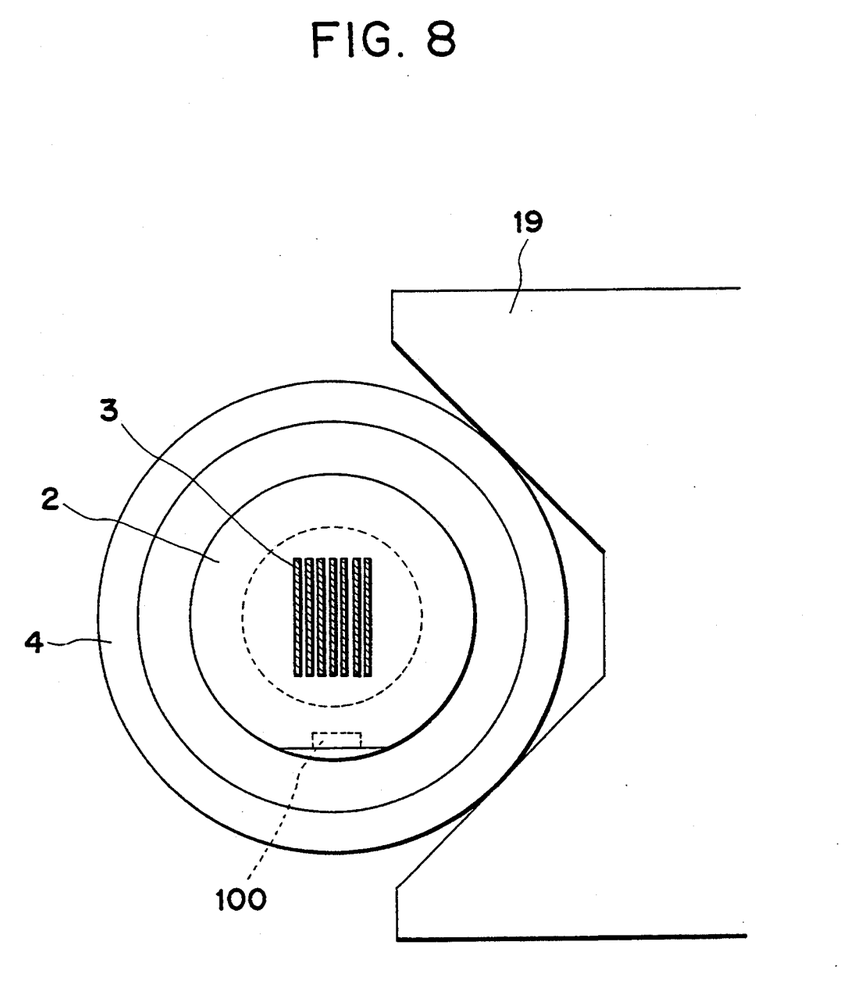
FIG. 8 shows a chucking direction of the mask structure in Example 5.

Furthermore, FIG. 7A is an enlarged schematic sectional view of an acceleration sensor portion, and FIG. 7B is its enlarged schematic front view.

A mask supporting frame 1 is formed from a silicon single crystal (thickness=4-5 mm) of face orientation (100) so as to permit forming an opening by anisotropic etching, and a mask support 2 having a thickness of about 2 μm is then formed from silicon nitride along the whole periphery of the supporting frame 1. In this case, a certain portion of a silicon substrate which will be removed later by etching is beforehand masked.

The upper surface of the supporting frame 1 on which an acceleration sensor 100 is formed is suitably flat considering the shape of a cantilever, a manufacturing process and the like, and in this example, a (110) face called an orientation flat is cut. As shown in FIGS. 7A and 7B, a cantilever structure 14 is composed of a sinker portion 14a and a cantilever 14b, and on the cantilever portion, a piezoelectric film 16 is formed between electrodes 17 and 18. A cavity portion 15 is formed by masking a certain silicon surface at the time of the formation of the silicon nitride film, and then etching the exposed silicon surface.

When this etching is carried out by anisotropic etching while the cantilever is inclined 54.7° to a vertical direction as shown in FIG. 7B, the etching in a (mask) surface direction can be inhibited, so that the rectangular cavity portion 15 can be obtained.

Signals from the electrodes 17 and 18 is led to a signal terminal portion formed on a mask chucking surface not shown via a lead-out electrode 6 formed on a mask retaining frame 4 and a wire bonding 7 or the like. In chucking the mask, the attachment of the cantilever is made so as to vibrate in a vertical direction. For example, under conditions that the cantilever structure is composed of a silicon nitride film having a thickness of 2 μm, the size of the sinker portion 14a is 1.5 mm×1.5 mm and the size of the cantilever portion 14b is 1.5 mm×0.15 mm, when a force of 10 gf is applied, a displacement quantity of the piezoelectric film 16 on the cantilever is about 4.5 μm. At this time, if the piezoelectric film comprises a barium titanate film having a thickness of 3,000 Å, an output voltage of 2-3 mV can be obtained.

Therefore, the X-ray exposure device can be provided with a mask fall preventing mechanism. According to the mask fall preventing mechanism, a change of the output voltage is fed back to the exposure device, and for example, when the mask deviates due to applied force, such a measure as increases force of the chucking can be taken, so that the drop of the mask can be prevented. For example, when the deviation is detected, a magnet for the chucking can be strengthened to increase the force of the chucking and to thereby prevent further deviation.

Furthermore, the X-ray exposure device can be provided with a breakage preventing mechanism. According to the breakage preventing mechanism, even if the chucking becomes abruptly inoperable and the mask falls, an acceleration which is applied at the fall beginning of the mask can be detected instantaneously, and the mask can be caught to escape breakage. Thus, the stop of operation for a long time due to mask breakage is avoidable.

In this case, it is a necessary requirement that the response velocity of a sensor is higher than a falling speed, but the acceleration sensor described in this example has the response velocity enough to cope with the worst trouble such as the fall of the mask.

As described above, a mask structure for X-ray exposure of the present invention can possess a function by which such a state change as causes exposure evenness can be detected, whereby the state change of the mask structure can always be monitored.

An X-ray exposure device of the present invention can possess an exposure stopping means. Thus, the state change is fed back to the control section of the X-ray exposure device, and for example, when the mask support is deformed by the movement of a stage, the exposure can be stopped. Furthermore, the X-ray exposure device of the present invention can also have a means for releasing charges, and thus, when the mask support is deformed by charging, the charges can be released. In consequence, the exposure which can provide a high pattern precision can be carried out, and the improvement of yield can also be achieved.

Moreover, according to the present invention, the deviation of the mask can be detected, and the X-ray exposure device can be provided with a mask fall preventing mechanism and a breakage preventing mechanism which operate in accordance with signals detected by the X-ray exposure device. These mechanisms can prevent the fall of the mask and can avoid trouble such as a long-time stop of operation due to the breakage of the mask in the exposure device.

What is claimed is:

1. A mask structure for X-ray exposure which comprises a retaining frame, a supporting frame, a mask support and an absorber pattern, said mask structure comprising means for detecting a change of acceleration of said mask structure from steady state.

2. The mask structure for X-ray exposure according to claim 1, wherein said mask structure is utilized for exposing plural regions on a wafer to X-rays one after another, and a change of acceleration of said mask structure occurs during movement of the wafer from one region to a next region.

3. The mask structure for X-ray exposure according to claim 1, which is used in a proximity exposure system.

4. The mask structure for X-ray exposure according to claim 1, further comprising an acceleration sensor, formed integrally with said supporting frame, for detecting acceleration of said supporting frame.

5. An X-ray exposure device using a mask structure for X-ray exposure according to claim 1, said X-ray exposure device comprising detecting means for detecting acceleration of said mask structure and a mask fall preventing mechanism, which operates in accordance with a signal obtained by said detecting means, for preventing a fall of said mask structure.

6. An X-ray exposure device using a mask structure for X-ray exposure according to claim 1, said X-ray exposure device comprising detecting means for detecting acceleration of said mask structure and a mask breakage preventing mechanism, which operates in accordance with a signal obtained by said detecting means, for preventing breakage of said mask structure.

7. A process of exposing plural regions on a wafer to X-rays using an X-ray mask structure which comprises a retaining frame, a supporting frame, a mask support and an absorber pattern, and which is utilized for exposing plural regions on a wafer to X-rays one after another, the mask structure further comprising detecting means for detecting a state change of the mask structure from its steady state during movement of the wafer from one region to the next region, said process comprising the steps of:

locating the mask support and the absorber pattern of the mask structure with a gap between the mask structure and the wafer having one distance;

exposing one region on the wafer to X-rays through the mask support and the absorber pattern of the mask structure;

widening the gap having the one distance to a gap having another distance and moving the next region on the wafer to be exposed toward the area beneath the mask structure;

narrowing the distance between the mask structure and the wafer to restore the latter gap to the former gap; and detecting recovery of the mask structure from a state change caused in said widening step and in said narrowing step to a steady state by the detecting means provided in the mask structure, and then exposing the next region to X-rays through the mask support and the absorber pattern.

8. A process of exposing plural regions on a wafer to X-rays using an X-ray mask structure which comprises a retaining frame, a supporting frame, a mask support and an absorber pattern, wherein the mask structure has a piezoelectric film formed on the surface of the mask support such that a change of bend quantity of the mask support from its steady state can be detected as an output voltage from the piezoelectric film, said process comprising the steps of:

exposing one region on the wafer to X-rays through the mask support and the absorber pattern of the mask structure;

moving a next region on the wafer to be exposed toward the area beneath the mask structure; and detecting recovery of the mask structure from a change of bending quantity caused in said moving step to a steady state by the piezoelectric film provided in the mask structure, and then exposing the next region to X-rays through the mask support and the absorber pattern.

9. A process of exposing plural regions on a wafer to X-rays using an X-ray mask structure which comprises a retaining frame, a supporting frame, a mask support and an absorber pattern, the mask structure comprising a piezoelectric film for detecting a change of acceleration of the mask structure from steady state, said process comprising the steps of:

exposing one region on the wafer to X-rays through the mask support and the absorber pattern of the mask structure;

moving a next region on the wafer to be exposed toward the area beneath the mask structure; and detecting recovery of the mask structure from a change of acceleration caused in said moving step to a steady state by the piezoelectric film provided in the mask structure, and then exposing the next region to X-rays through the mask support and the absorber pattern.

10. A mask structure for X-ray exposure which comprises a retaining frame, a supporting frame, a mask support and an absorber pattern, said mask support being provided with a piezoelectric displacement sensor for sensing displacement.

11. A mask structure for X-ray exposure which comprises a retaining frame, a supporting frame, a mask support and an absorber pattern, said supporting frame being provided with an acceleration sensor for sensing acceleration.

12. A mask structure for X-ray exposure which comprises a retaining frame, a supporting frame, a mask support and an absorber pattern, and which is utilized for exposing plural regions on a wafer to X-rays one after another, said mask structure further comprising means for detecting a state change of said mask structure from its steady state during movement of the wafer from one region to the next region.

13. The mask structure for X-ray exposure according to claim 12, which is used in a proximity exposure system.

14. The mask structure for X-ray exposure according to claim 12, wherein the state change is a change of bend quantity of said mask support.

15. The mask structure for X-ray exposure according to claim 13, wherein the state change is a change of bend quantity of said mask support.

16. The mask structure for X-ray exposure according to claim 14, wherein said detecting means detects a change of the bend quantity as an output voltage from a piezoelectric film formed on the surface of the mask support.

17. The mask structure for X-ray exposure according to claim 14, wherein said detecting means detects a change of the bend quantity as a change of capacitance between a wafer and an electrode formed on said surface of the mask support.

18. The mask structure for X-ray exposure according to claim 12, wherein the state change is a change of acceleration applied to said mask structure.

19. The mask structure for X-ray exposure according to claim 13, wherein the state change is a change of acceleration applied to said mask structure.

20. The mask structure for X-ray exposure according to claim 18, further comprising an acceleration sensor formed integrally with said supporting frame for detecting a change of the acceleration.

21. The mask structure for X-ray exposure according to claim 19, further comprising an acceleration sensor formed integrally with said supporting frame for detecting a change of the acceleration.

22. An X-ray exposure device using a mask structure for X-ray exposure according to claim 18, said X-ray exposure device comprising detecting means for detecting acceleration of said mask structure and a mask fall preventing mechanism, which operates in accordance with a signal obtained by said detecting means, for preventing a fall of said mask structure.

23. An X-ray exposure device using a mask structure for X-ray exposure according to claim 19, said X-ray exposure device comprising detecting means for detecting acceleration of said mask structure and a mask fall preventing mechanism, which operates in accordance with a signal obtained by said detecting means, for preventing a fall of said mask structure.

24. An X-ray exposure device using a mask structure for X-ray exposure according to claim 18, said X-ray exposure device comprising detecting means for detecting acceleration of said mask structure and a mask breakage preventing mechanism, which operates in accordance with a signal obtained by said detecting means, for preventing breakage of said mask structure.

25. An X-ray exposure device using a mask structure for X-ray exposure according to claim 19, said X-ray exposure device comprising detecting means for detecting acceleration of said mask structure and a mask breakage preventing mechanism, which operates in accordance with a signal obtained by said detecting means, for preventing breakage of said mask structure.

26. An X-ray exposure device using a mask structure for X-ray exposure according to claim 12, wherein said X-ray exposure device is controlled so as to begin exposure of a next region to X-rays after a detected state change of said mask structure has returned to a steady state.

27. The X-ray exposure device according to claim 26, wherein the state change is a change of bend quantity of said mask support.

28. The X-ray exposure device according to claim 26, wherein the state change is a change of acceleration of said mask support.

29. A mask structure for X-ray exposure which comprises a retaining frame, a supporting frame, a mask support and an absorber pattern, wherein said mask structure has a piezoelectric film formed on the surface of said mask support such that a change of bend quantity of said mask support from its steady state can be detected as an output voltage from said piezoelectric film.

30. The mask structure for X-ray exposure according to claim 29, wherein said mask structure is utilized for exposing plural regions on a wafer to X-rays one after another, and said piezoelectric film comprises means for detecting a change of bend quantity of said mask structure during movement of the wafer from one region to a next region.

31. The mask structure for X-ray exposure according to claim 29, which is used in a proximity exposure system.

32. The mask structure for X-ray exposure according to claim 29, wherein said piezoelectric film is a barium titanate film.

33. The mask structure for X-ray exposure according to claim 32, further comprising another barium titanate film, which is laminated on said barium titanate film to change a polar direction.

34. An X-ray exposure device using a mask structure for X-ray exposure according to claim 29, said X-ray exposure device being controlled so as to begin exposure after a detected change of the bend quantity of said mask support has returned to a steady state.

* * * * *